(12) United States Patent
Tao et al.

(10) Patent No.: US 11,231,795 B2
(45) Date of Patent: Jan. 25, 2022

(54) TOUCH CONTROL ARRAY SUBSTRATE HAVING A PLURALITY OF AUXILIARY CONDUCTIVE LINES, AND DISPLAY APPARATUS THEREOF

(71) Applicants: BOE TECHNOLOGY GROUP CO., LTD., Beijing (CN); Hefei BOE Optoelectronics Technology Co., Ltd., Anhui (CN)

(72) Inventors: Jian Tao, Beijing (CN); Hongmin Li, Beijing (CN); Fengjing Tang, Beijing (CN); Zhifu Dong, Beijing (CN); Wei Xue, Beijing (CN)

(73) Assignees: BOE TECHNOLOGY GROUP CO., LTD., Beijing (CN); Hefei BOE Optoelectronics Technology Co., Ltd., Anhui (CN)

( * ) Notice: Subject to any disclaimer, the term of this patent is extended or adjusted under 35 U.S.C. 154(b) by 834 days.

(21) Appl. No.: 16/065,049

(22) PCT Filed: Dec. 15, 2017

(86) PCT No.: PCT/CN2017/116579
§ 371 (c)(1),
(2) Date: Jun. 21, 2018

(87) PCT Pub. No.: WO2018/227913
PCT Pub. Date: Dec. 20, 2018

(65) Prior Publication Data
US 2021/0208760 A1 Jul. 8, 2021

(30) Foreign Application Priority Data
Jun. 14, 2017 (CN) .......................... 201710450196.8

(51) Int. Cl.
*G06F 3/041* (2006.01)
*G06F 3/044* (2006.01)

(52) U.S. Cl.
CPC .......... *G06F 3/0412* (2013.01); *G06F 3/0443* (2019.05); *G06F 3/04164* (2019.05); *G06F 2203/04103* (2013.01)

(58) Field of Classification Search
CPC .............. G06F 3/04164; G06F 3/0412; G06F 2203/04103
(Continued)

(56) References Cited

U.S. PATENT DOCUMENTS

2012/0268396 A1* 10/2012 Kim .................... H01L 27/1274
345/173
2013/0101251 A1 4/2013 Kawamura et al.
(Continued)

FOREIGN PATENT DOCUMENTS

CN 104536637 A * 4/2015 ........... G06F 3/0443
CN 104536637 A 4/2015
(Continued)

OTHER PUBLICATIONS

International Search Report & Written Opinion dated Mar. 15, 2018, regarding PCT/CN2017/116579.
(Continued)

*Primary Examiner* — Mark Edwards
(74) *Attorney, Agent, or Firm* — Intellectual Valley Law, P.C.

(57) ABSTRACT

The present application discloses a touch control array substrate having a plurality of subpixel areas. The touch control army substrate includes a base substrate; an array of a plurality of touch electrode blocks on the base substrate; a plurality of touch signal lines respectively electrically connected to the plurality of touch electrode blocks; and a
(Continued)

plurality of auxiliary conductive lines. A first touch electrode block of the plurality of touch electrode blocks is electrically connected to at least a first auxiliary conductive line of the plurality of auxiliary conductive lines at at least two different portions of the first touch electrode block.

20 Claims, 7 Drawing Sheets

(58) Field of Classification Search
USPC .......................................................... 345/174
See application file for complete search history.

(56) References Cited

U.S. PATENT DOCUMENTS

| | | | | |
|---|---|---|---|---|
| 2014/0111710 | A1* | 4/2014 | Yang | G06F 3/0443 349/12 |
| 2015/0041778 | A1 | 2/2015 | Chang et al. | |
| 2016/0283002 | A1* | 9/2016 | Liu | G06F 3/04164 |
| 2016/0291722 | A1* | 10/2016 | Du | G06F 3/0443 |
| 2016/0378254 | A1* | 12/2016 | Wang | G06F 3/0443 345/174 |
| 2017/0060317 | A1 | 3/2017 | Shimomoto | |
| 2017/0090662 | A1* | 3/2017 | Yang | G06F 3/0446 |
| 2017/0185210 | A1* | 6/2017 | Zhou | G06F 3/0412 |
| 2017/0192575 | A1* | 7/2017 | Jin | G06F 3/0412 |
| 2018/0299985 | A1 | 10/2018 | Wang et al. | |

FOREIGN PATENT DOCUMENTS

| | | | | |
|---|---|---|---|---|
| CN | 104699340 A | * | 6/2015 | ........... G06F 3/0446 |
| CN | 104699340 A | | 6/2015 | |
| CN | 204945586 U | | 1/2016 | |
| CN | 105677076 A | * | 6/2016 | ........... G06F 3/0412 |
| CN | 105677076 A | | 6/2016 | |
| CN | 205375439 U | | 7/2016 | |
| CN | 106095186 A | | 11/2016 | |
| CN | 106125989 A | | 11/2016 | |
| CN | 106201144 A | | 12/2016 | |

OTHER PUBLICATIONS

First Office Action in the Chinese Patent Application No. 201710450196. 8, dated Nov. 18, 2019; English translation attached.
Second Office Action in the Chinese Patent Application No. 201710450196.8, dated Apr. 27, 2020; English translation attached.

* cited by examiner

TOUCH CONTROL ARRAY SUBSTRATE HAVING A PLURALITY OF AUXILIARY CONDUCTIVE LINES, AND DISPLAY APPARATUS THEREOF

CROSS-REFERENCE TO RELATED APPLICATION

This application is a national stage application under 35 U.S.C. § 371 of International Application No. PCT/CN2017/116579, filed Dec. 15, 2017, which claims priority to Chinese Patent Application No. 201710450196.8, filed Jun. 14, 2017, the contents of which are incorporated by reference in the entirety.

TECHNICAL FIELD

The present invention relates to display technology, more particularly, to a touch control array substrate having a plurality of auxiliary conductive lines, and a display apparatus thereof.

BACKGROUND

In recent years, touch devices have been widely used in many electronic devices such as mobile phones, computer display panels, touch screens, satellite navigation devices, digital cameras, etc. Examples of touch devices include a mutual-capacitance touch control device and a self-capacitance touch control device. In a mutual-capacitance touch control device, the touch electrodes include multiple touch scanning electrodes (Tx) and multiple touch sensing electrodes (Rx). In a self-capacitance touch control device, the touch electrode can achieve touch control function alone. When a finger touches a point on the touch control display panel, the capacitor of the finger superimposes on the touch panel capacitor, resulting in a change in the capacitance of the touch panel capacitor. Based on the capacitance change upon a touch event, the coordinates of the first electrode and the second electrode being touched may be determined. In detecting touch events, the mutual capacitive touch display panel examines the touch scanning electrode array and the touch sensing electrode array sequentially. Touch resolution correlates with the distance between adjacent conductive channels. A smaller distance between adjacent conductive channels results in a higher touch resolution.

SUMMARY

In one aspect, the present invention provides a touch control array substrate having a plurality of subpixel areas, comprising a base substrate; an array of a plurality of touch electrode blocks on the base substrate; a plurality of touch signal lines respectively electrically connected to the plurality of touch electrode blocks; and a plurality of auxiliary conductive lines; wherein a first touch electrode block of the plurality of touch electrode blocks is electrically connected to at least a first auxiliary conductive line of the plurality of auxiliary conductive lines at at least two different portions of the first touch electrode block.

Optionally, each of the plurality of touch electrode blocks is electrically connected to at least one of the plurality of auxiliary conductive lines at at least two different portions.

Optionally, the first auxiliary conductive line is electrically connected to the at least two different portions of the first touch electrode block respectively through at least two first vias extending through an insulating layer between the plurality of touch electrode blocks and the plurality of auxiliary conductive lines.

Optionally, an orthographic projection of the first auxiliary conductive line on the base substrate is substantially covered by an orthographic projection of the first touch electrode block on the base substrate.

Optionally, the first auxiliary conductive line has a substantially same length along its extension direction as the first touch electrode block.

Optionally, each of the plurality of auxiliary conductive lines is in an inter-subpixel region of the touch control array substrate.

Optionally, the touch control array substrate further comprises a plurality of first signal lines and a plurality of second signal lines for driving image display in the plurality of subpixel areas in the touch control array substrate; wherein each of the plurality of auxiliary conductive lines is substantially parallel to the plurality of first signal lines.

Optionally, each of the plurality of auxiliary conductive lines is in a same layer and made of a same material as the plurality of first signal lines.

Optionally, for any three adjacent rows of subpixel areas of the plurality of subpixel areas comprising sequentially a first row, a second row, and a third row, the touch control array substrate comprises at least one of the plurality of auxiliary conductive lines between the first row and the second row and is free of any first signal line of the plurality of first signal lines between the first row and the second row; and the touch control army substrate comprises two first signal lines of the plurality of first signal lines between the second row and the third row and is free of any of the plurality of auxiliary conductive lines between the second row and the third row.

Optionally, the plurality of first signal lines comprise N numbers of gate lines for driving image display in N rows of subpixel areas of the plurality of subpixel areas; an n-th gate line for driving an n-th row of subpixel areas of the plurality of subpixel areas and an (n−1)-th gate line for driving an (n−1)-th row of subpixel areas of the plurality of subpixel areas are both between the n-th row of subpixel areas of the plurality of subpixel areas and the (n−1)-th row of subpixel areas of the plurality of subpixel areas; the touch control array substrate is free of any gate line between the n-th row of subpixel areas of the plurality of subpixel areas and the (n+1)-th row of subpixel areas of the plurality of subpixel areas one of the plurality of auxiliary conductive lines is between the n-th row of subpixel areas of the plurality of subpixel areas and the (n+1)-th row of subpixel areas of the plurality of subpixel areas; and n is an even number, N>n≥2.

Optionally, the plurality of first signal lines comprise N numbers of gate lines for driving image display in N rows of subpixel areas of the plurality of subpixel areas; an n-th gate line for driving an n-th row of subpixel areas of the plurality of subpixel areas and an (n+1)-th gate line for driving an (n+1)-th row of subpixel areas of the plurality of subpixel areas are both between the n-th row of subpixel areas of the plurality of subpixel areas and the (n+1)-th row of subpixel areas of the plurality of subpixel areas; the touch control array substrate is free of any gate line between the n-th row of subpixel areas of the plurality of subpixel areas and the (n−1)-th row of subpixel areas of the plurality of subpixel areas; one of the plurality of auxiliary conductive lines is between the n-th row of subpixel areas of the plurality of subpixel areas and the (n−1)-th row of subpixel areas of the plurality of subpixel areas; and n is an even number, N>n≥2.

Optionally, the touch control array substrate comprises a plurality of first signal lines and a plurality of second signal lines for driving image display in the plurality of subpixel areas in the touch control array substrate; wherein each of the plurality of touch signal lines is substantially parallel to the plurality of second signal lines.

Optionally, each of the plurality of touch signal lines is in a same layer and made of a same material as the plurality of second signal lines.

Optionally, for any three adjacent columns of subpixel areas of the plurality of subpixel areas comprising sequentially a first column, a second column, and a third column, the touch control array substrate comprises at least one of the plurality of touch signal lines between the first column and the second column and is free of any second signal line of the plurality of second signal lines between the first column and the second column; and the touch control array substrate comprises two second signal lines of the plurality of second signal lines between the second column and the third column and is free of any of the plurality of touch signal lines between the second column and the third column.

Optionally, the plurality of second signal lines comprise M numbers of data lines for driving image display in M columns of subpixel areas of the plurality of subpixel areas; a m-th data line for driving a m-th column of subpixel areas of the plurality of subpixel areas and a (m−1)-th data line for driving a (m−1)-th column of subpixel areas of the plurality of subpixel areas are both between the m-th column of subpixel areas of the plurality of subpixel areas and the (m−1)-th column of subpixel areas of the plurality of subpixel areas; the touch control array substrate is free of any data line between the m-th column of subpixel areas of the plurality of subpixel areas and the (m+1)-th column of subpixel areas of the plurality of subpixel areas; one of the plurality of touch signal lines is between the m-th column of subpixel areas of the plurality of subpixel areas and the (m+1)-th column of subpixel areas of the plurality of subpixel areas; and m is an even number. M≥m≥2.

Optionally, the plurality of second signal lines comprise M numbers of data lines for driving image display in M columns of subpixel areas of the plurality of subpixel areas; a m-th data line for driving a m-th column of subpixel areas of the plurality of subpixel areas and a (m+1)-th data line for driving a (m+1)-th column of subpixel areas of the plurality of subpixel areas are both between the m-th column of subpixel areas of the plurality of subpixel areas and the (m+1)-th column of subpixel areas of the plurality of subpixel areas; the touch control array substrate is free of any data line between the m-th column of subpixel areas of the plurality of subpixel areas and the (m−1)-th column of subpixel areas of the plurality of subpixel areas; one of the plurality of touch signal lines is between the m-th column of subpixel areas of the plurality of subpixel areas and the (m−1)-th column of subpixel areas of the plurality of subpixel areas; and m is an even number, M≥m≥2.

Optionally, the first touch electrode block is electrically connected to multiple auxiliary conductive lines of the plurality of auxiliary conductive lines; the multiple auxiliary conductive lines are spaced apart from each other and are evenly distributed over the first touch electrode block, and each of the multiple auxiliary conductive lines is electrically connected to at least two different portions of the first touch electrode block.

Optionally, a first touch signal line of the plurality of touch signal lines is electrically connected to at least two different portions of the first touch electrode block through at least at least two second vias extending through an insulating layer between the plurality of touch electrode blocks and the plurality of touch signal lines; and orthographic projections of the at least two first vias and the at least two second vias on the base substrate are evenly distributed over an orthographic projection of the first touch electrode block on the base substrate.

Optionally, the plurality of touch electrode blocks are configured to be operated in a time-division driving mode; the time-division driving mode comprises a touch control mode and a display mode; the plurality of touch signal lines are configured to provide a common voltage to the plurality of touch electrode blocks during the display mode, and are configured to transmit a touch signal during the touch control mode.

Optionally, the plurality of touch electrode blocks are a plurality of self-capacitive touch electrode blocks.

Optionally, the touch control array substrate is a full in-cell touch control array substrate.

In another aspect, the present invention provides a touch control array substrate, comprising a base substrate; a first conductive layer on the base substrate and comprising a plurality of first signal lines and a plurality of auxiliary conductive lines in a same layer, a first insulating layer on a side of the first conductive layer distal to the base substrate; a second conductive layer comprising a plurality of second signal lines and a plurality of touch signal lines in a same layer; a second insulating layer on a side of the second conductive layer distal to the first insulating layer; a touch electrode layer comprising a plurality of touch electrode blocks and on a side of the second insulating layer distal to the second conductive layer; a plurality of first vias extending through the first insulating layer and the second insulating layer; and a plurality of second vias extending through the second insulating layer; wherein each of the plurality of touch signal lines is electrically connected to one of the plurality of touch electrode blocks through one of the plurality of second vias; and each of the plurality of touch electrode blocks is electrically connected to at least one of the plurality of auxiliary conductive lines at at least two different portions.

In another aspect, the present invention provides a display apparatus, comprising the touch control array substrate described herein or fabricated by a method described herein.

Optionally, the display apparatus further comprises a plurality of first signal lines and a plurality of second signal lines for driving image display in the plurality of subpixel areas in the touch control array substrate; and a driver integrated circuit comprises a plurality of display driving regions and a plurality of touch control driving regions; the plurality of second signal lines are connected to the plurality of display driving regions; the plurality of touch signal lines are connected to the plurality of touch control driving regions; the plurality of display driving regions are evenly distributed in the driver integrated circuit, and the plurality of touch control driving regions are evenly distributed in the driver integrated circuit.

In another aspect, the present invention provides a method of driving a touch control display apparatus described herein, comprising driving the touch control display apparatus in a time-division driving mode, the time-division driving mode including a touch control mode and a display mode; wherein the method comprises transmitting one or more touch signals through the plurality of touch signal lines during the touch control mode; and providing a common voltage to the plurality of touch electrode blocks through the plurality of touch signal lines during the display mode; wherein the common voltage is provided to the first touch electrode block of the plurality of touch electrode blocks through the first auxiliary conductive line electrically connected to the at least two different portions of the first touch electrode block.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In some embodiments, a touch control display apparatus may be operated in a time-division driving mode, e.g., a plurality of touch electrode blocks in the touch control display apparatus can be operated in a time-division driving mode including a touch control mode and a display mode. In the display mode, a plurality of touch signal lines provide a common voltage to the plurality of touch electrode blocks. In the touch control mode, the plurality of touch signal lines transmit touch signals, e.g., to or from the plurality of touch electrode blocks. The plurality of touch electrode blocks are typically made of a transparent conductive material having a relatively large resistance, e.g., a metal oxide conductive material. The common voltage signal provided to the plurality of touch electrode blocks often decays from the contacting point with the touch signal line to other portions of the touch electrode block due to the relatively large resistance of the touch electrode block. As a result of the signal decaying, the common voltage signal is often insufficient to charge the entire touch electrode block, resulting in charging non-uniformity in the touch electrode block. The charging non-uniformity of the touch electrode block leads to display defects such as flicker, stripe, and greenish display.

Accordingly, the present disclosure provides, inter alia, a touch control array substrate having a plurality of auxiliary conductive lines and a display apparatus thereof that substantially obviate one or more of the problems due to limitations and disadvantages of the related art. In one aspect, the present disclosure provides a touch control array substrate having a plurality of subpixel areas. In some embodiments, the touch control array substrate includes a base substrate; an array of a plurality of touch electrode blocks on the base substrate; a plurality of touch signal lines respectively electrically connected to the plurality of touch electrode blocks; and a plurality of auxiliary conductive lines. Optionally, a first touch electrode block of the plurality of touch electrode blocks is electrically connected to at least a first auxiliary conductive line of the plurality of auxiliary conductive lines. The first auxiliary conductive line is electrically connected to at least two different portions of the first touch electrode block. Optionally, each of the plurality of touch electrode blocks is electrically connected to at least one of the plurality of auxiliary conductive lines. Optionally, the plurality of auxiliary conductive lines are in a layer different from that of the plurality of touch signal lines. Optionally, each of the plurality of auxiliary conductive lines is directly electrically connected to one of the plurality of touch electrode blocks only, and is only indirectly electrically connected to one of the plurality of touch signal lines through the one of the touch electrode blocks.

Figure 1:
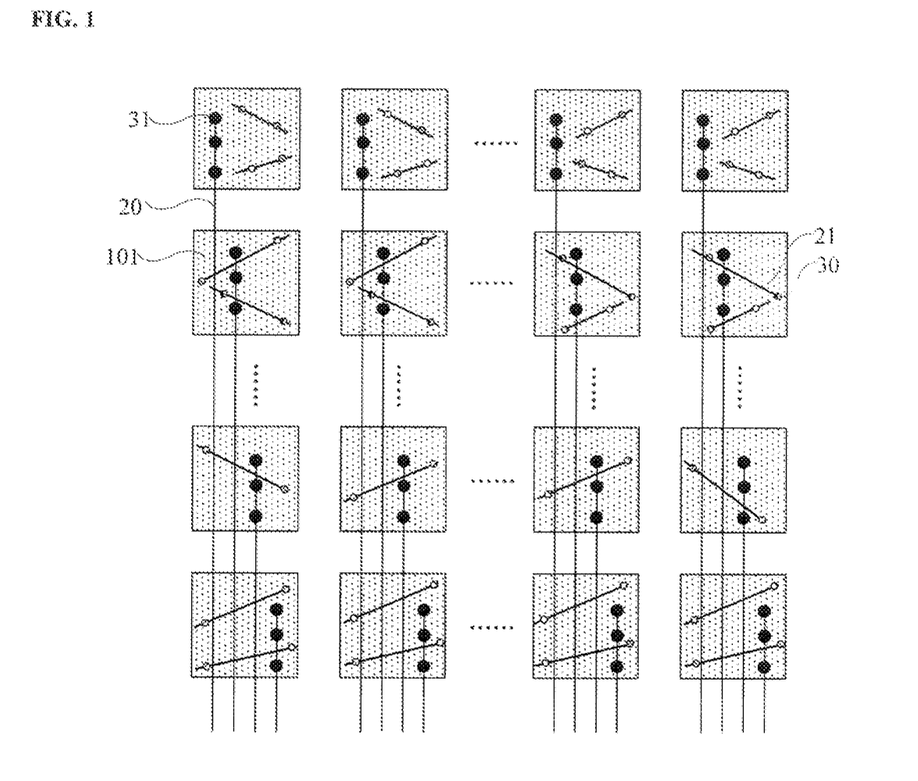
FIG. 1 is a schematic diagram illustrating the structure of a touch control array substrate in some embodiments according to the present disclosure.
Figure 2:
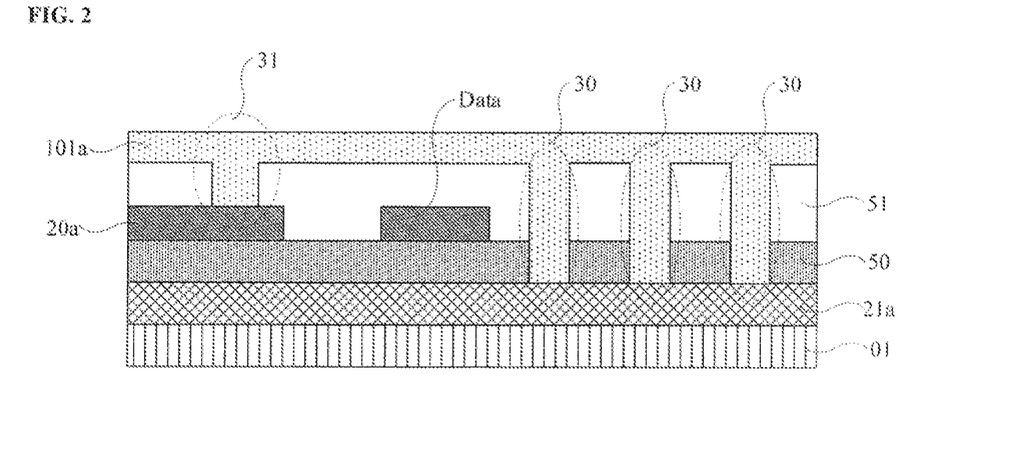
FIG. 2 is a cross-section of a touch control array substrate in some embodiments according to the present disclosure.

FIG. 1 is a schematic diagram illustrating the structure of a touch control array substrate in some embodiments according to the present disclosure. FIG. 2 is a cross-section of a touch control array substrate in some embodiments according to the present disclosure. Referring to FIG. 1 and FIG. 2, the touch control array substrate in some embodiments includes a base substrate 01; an array of a plurality of touch electrode blocks on the base substrate 01; a plurality of touch signal lines 20 respectively electrically connected to the plurality of touch electrode blocks 101; and a plurality of auxiliary conductive lines 21. Each of the plurality of touch signal lines 20 is electrically connected to a single one of the plurality of touch electrode blocks 101.

Optionally, the plurality of touch electrode blocks 101 are a plurality of self-capacitive touch electrode blocks. Optionally, the plurality of touch electrode blocks 101 are a plurality of touch electrode blocks in a mutual capacitive touch substrate. Optionally, the plurality of touch electrode blocks 101 are substantially transparent touch electrode blocks. Various appropriate touch electrode materials and various appropriate fabricating methods may be used for making the plurality of touch electrode blocks 101. Examples of appropriate touch electrode materials include indium tin oxide, indium zinc oxide, indium gallium zinc oxide, and so on.

In some embodiments, the touch control array substrate is configured to be operated in a time-division driving mode, e.g., the plurality of touch electrode blocks 101 are configured to be operated in a time-division driving mode. Optionally, the time-division driving mode includes a touch control mode and a display mode. Optionally, the plurality of touch signal lines 20 are configured to provide a common voltage to the plurality of touch electrode blocks 101 during the display mode, and are configured to transmit a touch signal during the touch control mode.

Optionally, the touch control array substrate further includes a pixel electrode. Optionally, the pixel electrode is a substantially transparent pixel electrode. Optionally, the pixel electrode is on a side of the plurality of touch electrode blocks 101 (the common electrode in the display mode)

distal to the base substrate 01. Optionally, the plurality of touch electrode blocks 101 (the common electrode in the display mode) is on a side of the pixel electrode distal to the base substrate 01. Optionally, the pixel electrode includes a plurality of branches spaced apart from each other.

Figure 3:
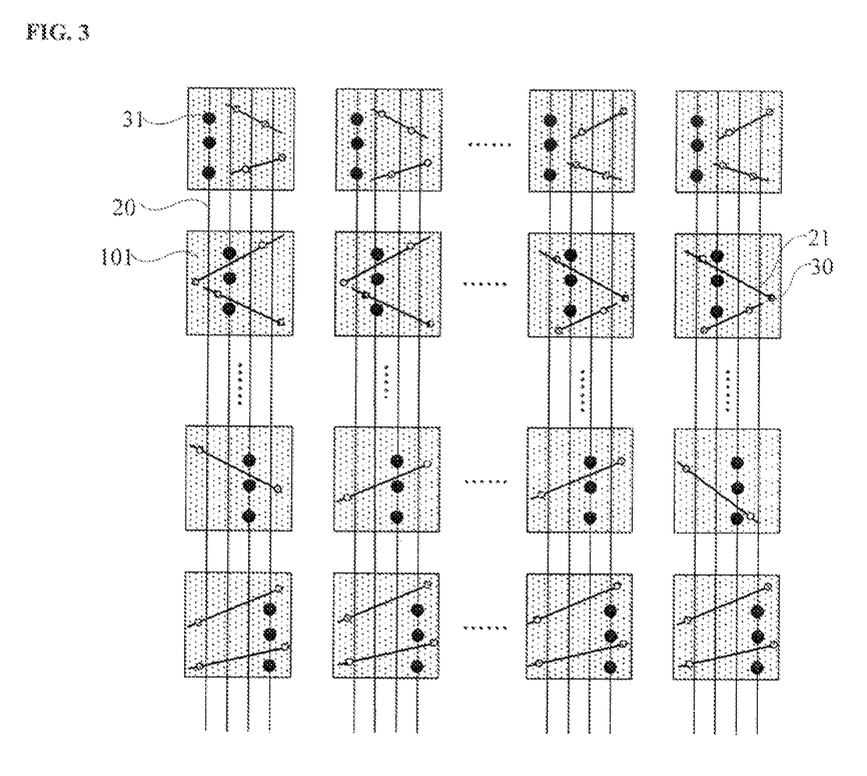
FIG. 3 is a schematic diagram illustrating the structure of a touch control array substrate in some embodiments according to the present disclosure.

In some embodiments, each of the plurality of touch signal lines 20 extends from a driver integrated circuit in a peripheral area of the touch control array substrate to connecting points with one of the plurality of touch electrode blocks 101 corresponding to (e.g., receiving touch signal from) each of the plurality of touch signal lines 20. For example, the touch signal lines of the plurality of touch signal lines 20 connected to the touch electrode blocks in the second row of the plurality of touch electrode blocks 101 extend from the peripheral area to a region corresponding to the second row of the plurality of touch electrode blocks 101, but not further into the third row of the plurality of touch electrode blocks 101. FIG. 3 is a schematic diagram illustrating the structure of a touch control array substrate in some embodiments according to the present disclosure. Referring to FIG. 3, the plurality of touch signal lines 20 substantially extend over the entire touch control array substrate. e.g., each of the plurality of touch signal lines 20 crosses over every row of the plurality of touch electrode blocks 101. By having the routing of the plurality of touch signal lines 20 as shown in FIG. 3, the plurality of touch signal lines 20 are evenly distributed over the touch control array substrate, avoiding display non-uniformity due to the absence of the touch signal lines in certain areas.

Referring to FIG. 2, a first touch electrode block 101a of the plurality of touch electrode blocks 101 and a first auxiliary conductive line 21a of the plurality of auxiliary conductive lines 21 are shown in the figure. In some embodiments, the first touch electrode block 101a of the plurality of touch electrode blocks 101 is electrically connected to at least a first auxiliary conductive line 21a of the plurality of auxiliary conductive lines 21. Optionally, the first touch electrode block 101a of the plurality of touch electrode blocks 101 is electrically connected to a single auxiliary conductive line of the plurality of auxiliary conductive lines 21. Optionally, the first touch electrode block 101a of the plurality of touch electrode blocks 101 is electrically connected to multiple auxiliary conductive lines of the plurality of auxiliary conductive lines 21. Optionally, each of the plurality of touch electrode blocks 101 is electrically connected to a auxiliary conductive line of the plurality of auxiliary conductive lines 21. Optionally, each of the plurality of touch electrode blocks 101 is electrically connected to multiple auxiliary conductive lines of the plurality of auxiliary conductive lines 21.

The first auxiliary conductive line 21a is electrically connected to at least two different portions of the first touch electrode block. Referring to FIG. 2, the first auxiliary conductive line 21a is electrically connected to the at least two different portions of the first touch electrode block 101a respectively through at least two first vias 30 (e.g., three first vias 30) extending through an insulating layer (e.g., a combination of a first insulating layer 50 and a second insulating layer 51) between the first auxiliary conductive line 21a and the first touch electrode block 101a. Optionally, each of the plurality of auxiliary conductive lines 21 is electrically connected to at least two portions of one of the plurality of touch electrode blocks 101, e.g., through at least two vias extending through an insulating layer between the plurality of touch electrode blocks 101 and the plurality of auxiliary conductive lines 21.

Referring to FIG. 2 and FIG. 1, in some embodiments, a first touch signal line 20a of the plurality of touch signal lines 20 is electrically connected to one or more portions of the first touch electrode block 101a through one or more second vias 31 extending through the insulating layer between the first touch electrode block 101a and the first touch signal line 20a. Optionally, the first touch signal line 20a of the plurality of touch signal lines 20 is electrically connected to at least two different portions of the first touch electrode block 101a through at least two second vias 31 extending through an insulating layer (e.g., the second insulating layer 51 in FIG. 2) between the first touch electrode block 101a and the first touch signal line 20a. Optionally, each of the plurality of touch signal lines 20 is electrically connected to one or more (e.g., at least two different) portions of one of the plurality of touch electrode blocks 101, e.g., through one or more (e.g., at least two) second vias 31 extending through an insulating layer between the plurality of touch electrode blocks 101 and the plurality of touch signal lines 20. Optionally, orthographic projections of the at least two second vias 31 on the base substrate 01 are evenly distributed over an orthographic projection of the first touch electrode block 101a on the base substrate 01.

In some embodiments, an orthographic projection of the first auxiliary conductive line 21a on the base substrate 01 is substantially covered by an orthographic projection of the first touch electrode block 101a on the base substrate 01. Optionally, an orthographic projection of each of the plurality of auxiliary conductive lines 21 on the base substrate 01 is substantially covered by an orthographic projection of one of the plurality of touch electrode blocks 101.

In some embodiments, an orthographic projection of the first auxiliary conductive line 21a on the base substrate 01 extends outside an orthographic projection of the first touch electrode block 101a on the base substrate 01.

Each of the plurality of auxiliary conductive lines 21 may have any appropriate extension direction. Optionally, the extension direction can be substantially parallel to that of the plurality of touch signal lines 20. Optionally, the extension direction can be substantially perpendicular to that of the plurality of touch signal lines 20. Optionally, the extension direction and the extension direction of the plurality of touch signal lines 20 can form an angle other than 90 degrees.

When the touch control array substrate is operated in a time-division driving mode, each of the plurality of touch signal lines 20 is configured to provide a common voltage to one of the plurality of touch electrode blocks 101 during the display mode, and is configured to transmit a touch signal during the touch control mode. In some embodiments, the touch control array substrate is a touch control array substrate in a full in-cell touch control display apparatus, which obviates the need of having a touch panel external to the display module. In the full in-cell touch control display apparatus, the issue caused by the light reflection at the interface between the external touch panel and the display module does not exist because the display apparatus does not include a touch panel disposed external to the display module. Display quality can be significantly enhanced, particular in an outdoor environment where ambient light intensity is relatively high. Moreover, the display apparatus can be made to have a high transmittance rate and a small thickness.

By having the plurality of auxiliary conductive lines 21 (e.g., the first auxiliary conductive line 21a) each connecting two portions of one of the plurality of touch electrode blocks 101, the common voltage provided to the one of the plurality of touch electrode blocks 101 (e.g., the first touch electrode block 101a) through one of the plurality of touch signal lines 20 during the display mode can be transmitted throughout the one of the plurality of touch electrode blocks. Referring to FIG. 2, during the display mode, the common voltage is provided to the first touch electrode block 101a through the first touch signal line 20a (through the second via 31). The common voltage transmits through the first touch electrode block 101a and one of the first vias 30 to the first auxiliary conductive line 21a. The common voltage then transmits through the first auxiliary conductive line 21a to other portions of the first touch electrode block 101a. By having at least two first vias 30, the common voltage can be transmitted from one portion of the first touch electrode block 101a to at least one other portion of the first touch electrode block 101a. As a result, the charging non-uniformity of the first touch electrode block 101a (due to the resistance of the first touch electrode block 101a) can be significantly improved, reducing display defects such as flicker and stripe caused by the charging non-uniformity of the first touch electrode block 101a.

Optionally, orthographic projections of the at least two first vias 30 on the base substrate 01 are evenly distributed over an orthographic projection of the first touch electrode block 101a on the base substrate 01. This design further improves charge uniformity of the first touch electrode block 101a.

Optionally, the first touch electrode block 101a is electrically connected to multiple auxiliary conductive lines of the plurality of auxiliary conductive lines 21. Optionally, each of the multiple auxiliary conductive lines is electrically connected to at least two different portions of the first touch electrode block 101a. Optionally, the multiple auxiliary conductive lines are spaced apart from each other and are evenly distributed over the first touch electrode block 101a. Optionally, each of the plurality of touch electrode blocks 101 is electrically connected to multiple auxiliary conductive lines of the plurality of auxiliary conductive lines 21. Optionally, each of the multiple auxiliary conductive lines is electrically connected to at least two different portions of one of the plurality of touch electrode blocks 101. Optionally, the multiple auxiliary conductive lines are spaced apart from each other and are evenly distributed over the one of the plurality of touch electrode blocks 101.

In some embodiments, the arrays substrate includes a plurality of first signal lines and a plurality of second signal lines for driving image display in the plurality of subpixel areas in the touch control array substrate. Optionally, the plurality of first signal lines are a plurality of gate lines, and the plurality of second signal lines are a plurality of data lines. Optionally, the plurality of first signal lines are a plurality of data lines, and the plurality of second signal lines are a plurality of gate lines.

In some embodiments, each of the plurality of auxiliary conductive lines 21 is substantially parallel to the plurality of first signal lines. Optionally, each of the plurality of auxiliary conductive lines 21 is substantially parallel to the plurality of gate lines. Optionally, each of the plurality of auxiliary conductive lines 21 is substantially parallel to the plurality of data lines. Optionally, each of the plurality of auxiliary conductive lines 21 is in a same layer and made of a same material as the plurality of first signal lines.

Figure 4:
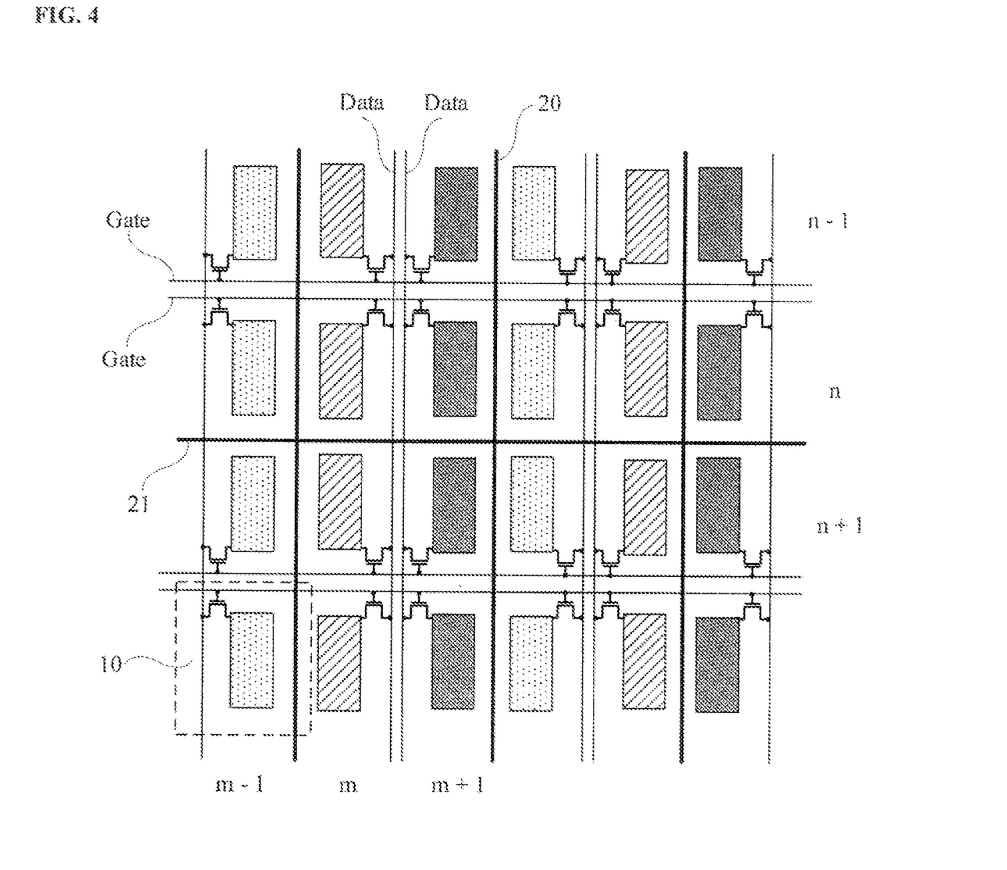
FIG. 4 is a schematic diagram illustrating the routing of various signal lines in a touch control army substrate in some embodiments according to the present disclosure.

FIG. 4 is a schematic diagram illustrating the routing of various signal lines in a touch control array substrate in some embodiments according to the present disclosure. Referring to FIG. 4, the touch control array substrate includes a plurality of gate lines Gate and a plurality of data lines Data.

The touch control array substrate includes a plurality of subpixel areas 10. The plurality of gate lines Gate and the plurality of data lines Data drive image display in the plurality of subpixel areas 10. Referring to FIG. 4, the plurality of gate lines Gate include N numbers of gate lines for driving image display in N rows of subpixel areas of the plurality of subpixel areas 10. Optionally, an n-th gate line for driving an n-th row of subpixel areas of the plurality of subpixel areas and an (n−1)-th gate line for driving an (n−1)-th row of subpixel areas of the plurality of subpixel areas are both between the n-th row of subpixel areas of the plurality of subpixel areas and the (n−1)-th row of subpixel areas of the plurality of subpixel areas 10. Optionally, the touch control array substrate is free of any gate line between the n-th row of subpixel areas of the plurality of subpixel areas and the (n+1)-th row of subpixel areas of the plurality of subpixel areas 10. Optionally, one of the plurality of auxiliary conductive lines 21 is between the n-th row of subpixel areas of the plurality of subpixel areas and the (n+1)-th row of subpixel areas of the plurality of subpixel areas 10. Optionally, n is an even number, $N>n\geq 2$.

Figure 5:
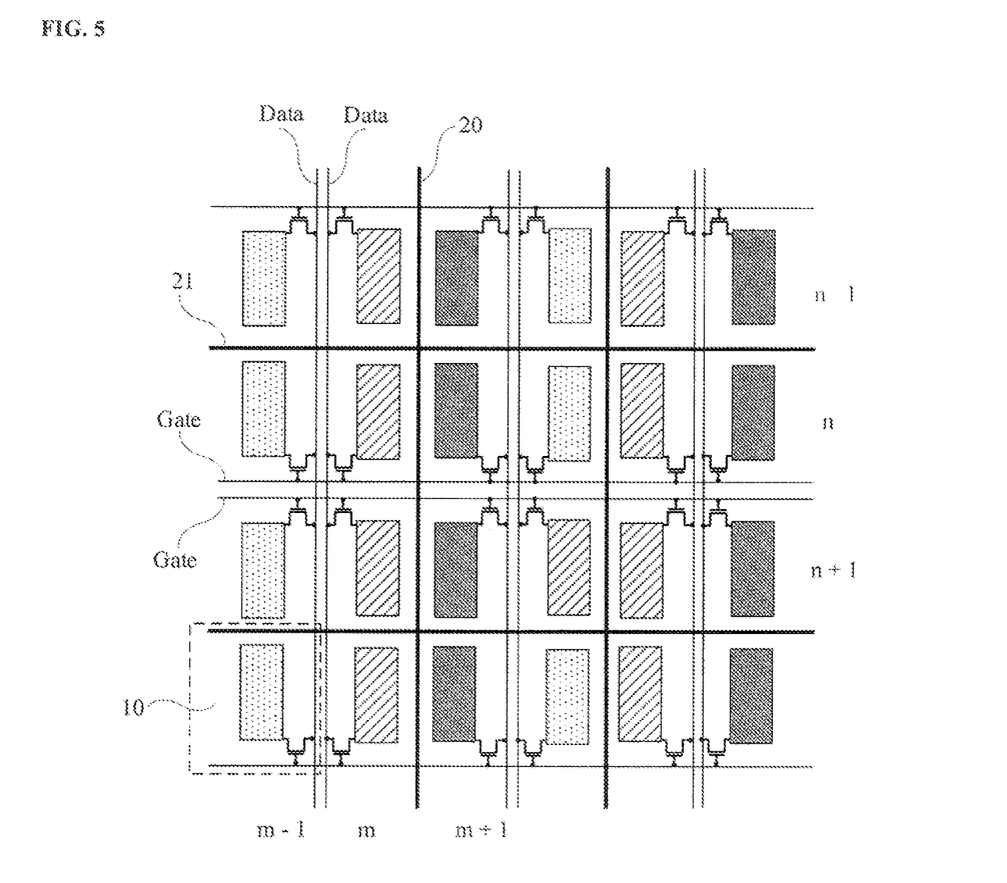
FIG. 5 is a schematic diagram illustrating the routing of various signal lines in a touch control array substrate in some embodiments according to the present disclosure.

FIG. 5 is a schematic diagram illustrating the routing of various signal lines in a touch control array substrate in some embodiments according to the present disclosure. Referring to FIG. 5, an n-th gate line for driving an n-th row of subpixel areas of the plurality of subpixel areas and an (n+1)-th gate line for driving an (n+1)-th row of subpixel areas of the plurality of subpixel areas are both between the n-th row of subpixel areas of the plurality of subpixel areas and the (n+1)-th row of subpixel areas of the plurality of subpixel areas 10. Optionally, the touch control array substrate is free of any gate line between the n-th row of subpixel areas of the plurality of subpixel areas and the (n−1)-th row of subpixel areas of the plurality of subpixel areas 10. Optionally, one of the plurality of auxiliary conductive lines 21 is between the n-th row of subpixel areas of the plurality of subpixel areas and the (n−1)-th row of subpixel areas of the plurality of subpixel areas 10. Optionally, n is an even number. $N>n\geq 2$.

In some embodiments, the plurality of auxiliary conductive lines 21 are in a same layer, made of a same material, and fabricated in a same patterning process using a same mask plate as the plurality of gate lines Gate. The fabrication process can be simplified and the fabrication costs lowered. Optionally, the plurality of gate lines Gate and the plurality of auxiliary conductive lines 21 are made of a metal material for enhanced conductivity. By having the plurality of auxiliary conductive lines 21 made of a metal of high conductivity, the charging uniformity of the plurality of touch electrode blocks 101 during the display mode can be further enhanced because the plurality of auxiliary conductive lines 21 can transmit the common voltage to different portions of the electrode block without significant signal reduction.

As used herein, the term "same layer" refers to the relationship between the layers simultaneously formed in the same step. In one example, the plurality of auxiliary conductive lines 21 and the plurality of gate lines Gate are in a same layer when they are formed as a result of one or more steps of a same patterning process performed in a same layer of material. In another example, the plurality of auxiliary conductive lines 21 and the plurality of gate lines Gate can be formed in a same layer by simultaneously performing the step of forming the plurality of auxiliary conductive lines 21 and the step of forming the plurality of gate lines Gate. The term "same layer" does not always mean that the thickness of the layer or the height of the layer in a cross-sectional view is the same.

Optionally, the plurality of auxiliary conductive lines 21 are substantially parallel to the plurality of gate lines Gate.

By having the routing designs as illustrated in FIG. 4 and FIG. 5, each of the plurality of auxiliary conductive lines 21 is disposed in an inter-subpixel region, e.g., an inter-subpixel region free of any gate lines. Accordingly, any adjacent gate line and auxiliary conductive line are spaced apart by at least one of the plurality of subpixel areas 10. As a result, cross-talk between the plurality of auxiliary conductive lines 21 and the plurality of gate lines Gate can be reduced or eliminated.

As used herein, a subpixel region refers to a light emission region of a subpixel, such as a region corresponding to a pixel electrode in a liquid crystal display, a region corresponding to a light emissive layer in an organic light emitting diode display panel, or a region corresponding to the light transmission layer in the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel.

As used herein, an inter-subpixel region refers to a region between adjacent subpixel regions, such as a region corresponding to a black matrix in a liquid crystal display, a region corresponding a pixel definition layer in an organic light emitting diode display panel, or a black matrix in the present display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

In some embodiments, and as depicted in FIG. 4 and FIG. 5, for any three adjacent rows of subpixel areas of the plurality of subpixel areas 10 including sequentially a first row, a second row, and a third row, the touch control array substrate includes at least one of the plurality of auxiliary conductive lines 21 between the first row and the second row and is free of any gate line between the first row and the second row. Optionally, the touch control array substrate includes two first signal lines (e.g., two gate lines) of the plurality of first signal lines (e.g., the plurality of gate lines Gate) between the second row and the third row and is free of any of the plurality of auxiliary conductive lines 21 between the second row and the third row. By having this design, the plurality of auxiliary conductive lines 21 can be substantially evenly distributed in the touch control array substrate, accordingly the common voltage can be substantially evenly distributed in each of the plurality of touch electrode blocks 101. Moreover, display defects due to signal line routing non-uniformity can be avoided.

In some embodiments, the first auxiliary conductive line 21a has a substantially same length along its extension direction as the first touch electrode block 101a. Optionally, each of the plurality of auxiliary conductive lines 21 has a substantially same length along its extension direction as one of the plurality of touch electrode blocks 101. By having this design, the charging uniformity of the plurality of touch electrode blocks 101 can be further improved.

By having the first auxiliary conductive line 21a to have a substantially same length along its extension direction as the first touch electrode block 101a, the at least two first vias 30 can be disposed along an edge of the first touch electrode block 101a. As a result, the common voltage can be readily transmitted to the edge of the first touch electrode block 101a, further enhancing the charging uniformity of the first touch electrode block 101a.

In some embodiments, the first touch electrode block 101a has a substantially square shape. Optionally, each of the plurality of touch electrode blocks 101 has a substantially square shape. Optionally, each of the plurality of touch electrode blocks 101 corresponds to an array of multiple subpixel areas of the plurality of subpixel areas 10. In one example, each of the plurality of touch electrode blocks 101 corresponds to an array of 40×40 subpixel areas. In another example, each of the plurality of touch electrode blocks 101 corresponds to an array of 30×30 subpixel areas.

In some embodiments, each of the plurality of touch signal lines 20 is substantially parallel to the plurality of second signal lines. Optionally, each of the plurality of touch signal lines 20 is substantially parallel to the plurality of data lines. Optionally, each of the plurality of touch signal lines 20 is substantially parallel to the plurality of gate lines. Optionally, each of the plurality of touch signal lines 20 is in a same layer and made of a same material as the plurality of second signal lines.

Referring to FIG. 5, the touch control army substrate includes a plurality of gate lines Gate and a plurality of data lines Data. The touch control array substrate includes a plurality of subpixel areas 10. The plurality of gate lines Gate and the plurality of data lines Data drive image display in the plurality of subpixel areas 10. In some embodiments, the plurality of data lines Data includes M numbers of data lines for driving image display in M columns of subpixel areas of the plurality of subpixel areas 10. Optionally, a m-th data line for driving a m-th column of subpixel areas of the plurality of subpixel areas and a (m−1)-th data line for driving a (m−1)-th column of subpixel areas of the plurality of subpixel areas are both between the m-th column of subpixel areas of the plurality of subpixel areas and the (m−1)-th column of subpixel areas of the plurality of subpixel areas 10. Optionally, the touch control array substrate is free of any data line between the m-th column of subpixel areas of the plurality of subpixel areas and the (m+1)-th column of subpixel areas of the plurality of subpixel areas 10. Optionally, one of the plurality of touch signal lines is between the m-th column of subpixel areas of the plurality of subpixel areas and the (m+1)-th column of subpixel areas of the plurality of subpixel areas 10. Optionally, m is an even number, M≥m≥2.

Referring to FIG. 4, a m-th data line for driving a m-th column of subpixel areas of the plurality of subpixel areas and a (m+1)-th data line for driving a (m+1)-th column of subpixel areas of the plurality of subpixel areas are both between the m-th column of subpixel areas of the plurality of subpixel areas and the (m+1)-th column of subpixel areas of the plurality of subpixel areas 10. Optionally, the touch control array substrate is free of any data line between the m-th column of subpixel areas of the plurality of subpixel areas and the (m−1)-th column of subpixel areas of the plurality of subpixel areas 10. Optionally, one of the plurality of touch signal lines is between the m-th column of subpixel areas of the plurality of subpixel areas and the (m−1)-th column of subpixel areas of the plurality of subpixel areas 10. Optionally, m is an even number, M≥m≥2.

In some embodiments, the plurality of touch signal lines 20 are in a same layer, made of a same material, and fabricated in a same patterning process using a same mask plate as the plurality of data lines Data. The fabrication process can be simplified and the fabrication costs lowered.

Optionally, the plurality of touch signal lines 20 are substantially parallel to the plurality of data lines Data.

By having the routing designs as illustrated in FIG. 4 and FIG. 5, each of the plurality of touch signal lines 21 is disposed in an inter-subpixel region, e.g., an inter-subpixel region free of any data lines. Accordingly, any adjacent data line and touch signal line are spaced apart by at least one of the plurality of subpixel areas 10. As a result, cross-talk between the plurality of touch signal lines 20 and the plurality of data lines Data can be reduced or eliminated.

In some embodiments, and as depicted in FIG. 4 and FIG. 5, for any three adjacent columns of subpixel areas of the plurality of subpixel areas 10 including sequentially a first column, a second column, and a third column, the touch control array substrate includes at least one of the plurality of touch signal lines 20 between the first column and the second column and is free of any data line between the first column and the second column. Optionally, the touch control array substrate comprises two second signal lines (e.g., two data lines) of the plurality of second signal lines (e.g., the plurality of data lines Data) between the second column and the third column and is free of any of the plurality of touch signal lines 20 between the second column and the third column. By having this design, the plurality of touch signal lines 20 can be substantially evenly distributed in the touch control array substrate, avoiding display defects due to signal line routing non-uniformity.

Referring to FIGS. 1, 2, and 3, in some embodiments, a first touch signal line 20a of the plurality of touch signal lines 20 is electrically connected to at least two different portions of the first touch electrode block 101a through at least at least two second vias 31 extending through the insulating layer (e.g., the second insulating layer 51) between the first touch electrode block 101a and the first touch signal line 20a. Optionally, each of the plurality of touch signal lines 20 is electrically connected to at least two different portions of one of the plurality of touch electrode blocks 101 through at least at least two second vias 31 extending through the insulating layer the plurality of touch electrode blocks 101 and the plurality of touch signal lines 20. Optionally, orthographic projections of the at least two first vias 31 and the at least two second vias 30 on the base substrate are evenly distributed over an orthographic projection of the first touch electrode block 101a on the base substrate 01.

In another aspect, the present disclosure provides a display apparatus having a touch control array substrate described herein or fabricated by a method described herein. Optionally, the display apparatus is a liquid crystal display apparatus. Optionally, the display apparatus is an organic light emitting diode display apparatus. Optionally, the display apparatus is an electrophoretic display apparatus. Examples of appropriate display apparatuses include, but are not limited to, an electronic paper, a mobile phone, a tablet computer, a television, a monitor, a notebook computer, a digital album, a GPS, etc.

In some embodiments, the display apparatus further includes a plurality of first signal lines and a plurality of second signal lines for driving image display in the plurality of subpixel areas in the touch control array substrate. Optionally, the plurality of first signal lines are a plurality of gate lines, and the plurality of second signal lines are a plurality of data lines. Optionally, the plurality of first signal lines are a plurality of data lines, and the plurality of second signal lines are a plurality of gate lines.

In some embodiments, the display apparatus further includes a driver integrated circuit having a plurality of display driving regions and a plurality of touch control driving regions. Optionally, the plurality of second signal lines are connected to the plurality of display driving regions, and the plurality of touch signal lines are connected to the plurality of touch control driving regions. Optionally, the plurality of second signal lines are a plurality of data lines. Optionally, the plurality of display driving regions are evenly distributed in the driver integrated circuit. Optionally, the plurality of touch control driving regions are evenly distributed in the driver integrated circuit.

Figure 6:
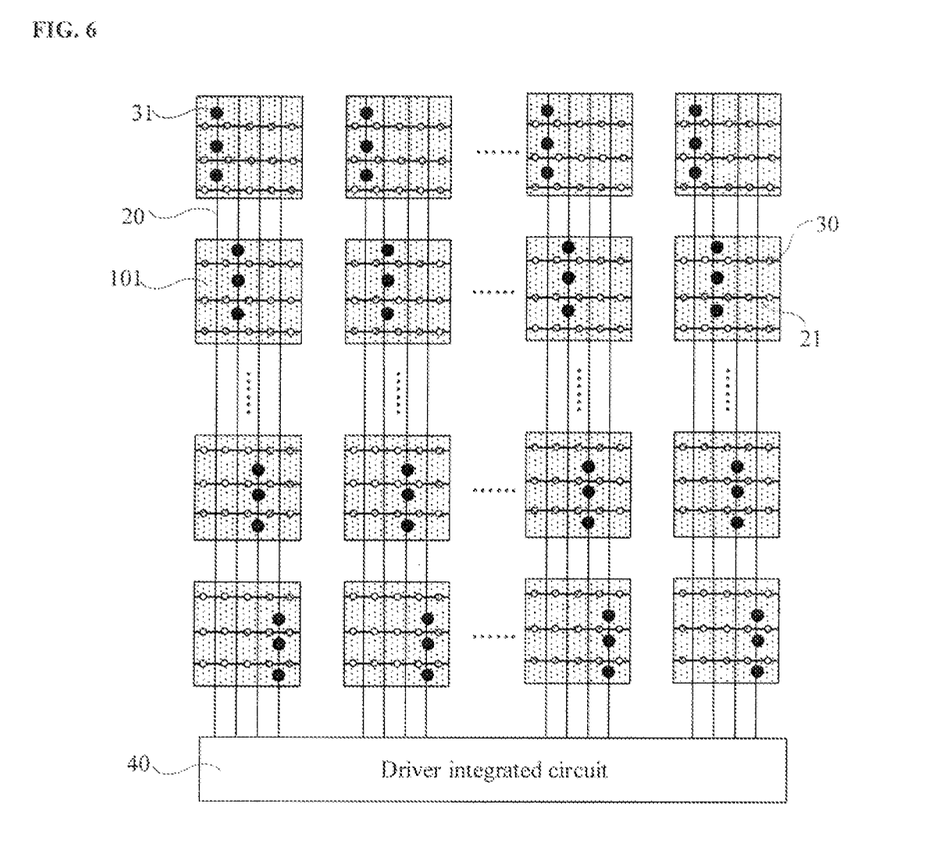
FIG. 6 is a schematic diagram illustrating the structure of a touch control army substrate in some embodiments according to the present disclosure.
Figure 7:
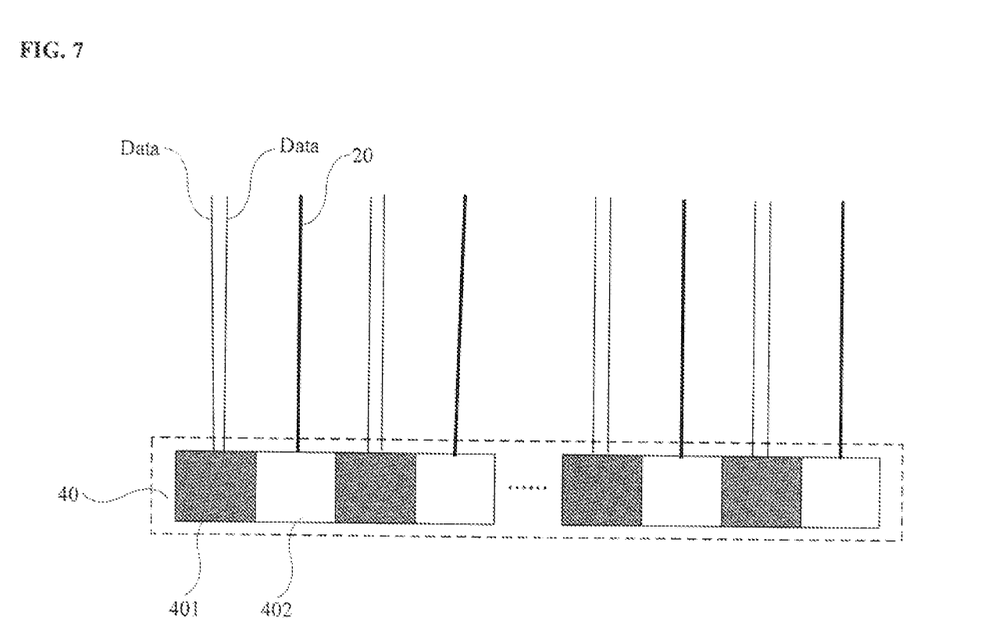
FIG. 7 is schematic diagram illustrating the routing of various signal lines into a driver integrated circuit in some embodiments according to the present disclosure.

FIG. 6 is a schematic diagram illustrating the structure of a touch control array substrate in some embodiments according to the present disclosure. FIG. 7 is schematic diagram illustrating the routing of various signal lines into a driver integrated circuit in some embodiments according to the present disclosure. Referring to FIG. 6 and FIG. 7, the display apparatus in some embodiments further includes a driver integrated circuit 40 including a plurality of display driving regions 401 and a plurality of touch control driving regions 402. The driver integrated circuit 40 is configured to provide data signals to the plurality of data lines Data connected to the plurality of display driving regions 401. The driver integrated circuit 40 is configured to provide touch signals to the plurality of touch signal lines 20 connected to the plurality of touch control driving regions 402. When the display apparatus is operated in a time-division mode, the driver integrated circuit 40 is configured to provide a common voltage signal to the plurality of touch signal lines 20 connected to the plurality of touch control driving regions 402. Optionally, the touch control mode occurs in a blank time between adjacent two frames of images.

Optionally, the plurality of display driving regions 401 are evenly distributed in the driver integrated circuit 40. Optionally, the plurality of touch control driving regions 402 are evenly distributed in the driver integrated circuit 40. Optionally, the plurality of display driving regions 401 and the plurality of touch control driving regions 402 are alternately disposed in the driver integrated circuit 40, as shown in FIG. 7. Optionally, the touch control array substrate is a full in-cell touch control array substrate, and touch and display driver integration (TDDI) can be achieved in the present display apparatus.

In some embodiments, the touch control array substrate includes a base substrate, a first conductive layer having a plurality of first signal lines and a plurality of auxiliary conductive lines in a same layer; a touch electrode layer having a plurality of touch electrode blocks. Each of the plurality of touch electrode blocks is electrically connected to at least one of the plurality of auxiliary conductive lines at at least two different portions.

Optionally, the touch control array substrate includes a base substrate, a gate layer having a plurality of gate lines and a plurality of auxiliary conductive lines in a same layer; a touch electrode layer having a plurality of touch electrode blocks. Each of the plurality of touch electrode blocks is electrically connected to at least one of the plurality of auxiliary conductive lines at at least two different portions.

Optionally, the touch control array substrate includes a base substrate, a data layer having a plurality of data lines and a plurality of auxiliary conductive lines in a same layer; a touch electrode layer having a plurality of touch electrode blocks. Each of the plurality of touch electrode blocks is electrically connected to at least one of the plurality of auxiliary conductive lines at at least two different portions.

In some embodiments, the touch control array substrate includes a base substrate; a first conductive layer having a plurality of first signal lines and a plurality of auxiliary conductive lines in a same layer; a first insulating layer on a side of the first conductive layer distal to the base substrate; a second conductive layer having a plurality of second signal lines and a plurality of touch signal lines in a same layer; a second insulating layer on a side of the second conductive layer distal to the first insulating layer; a touch electrode layer having a plurality of touch electrode blocks and on a side of the second insulating layer distal to the second conductive layer; a plurality of first vias extending through the first insulating layer and the second insulating layer; and a plurality of second vias extending through the second insulating layer. Each of the plurality of touch signal lines is electrically connected to one of the plurality of touch electrode blocks through one of the plurality of second vias. Each of the plurality of touch electrode blocks is electrically connected to at least one of the plurality of auxiliary conductive lines at at least two different portions.

Optionally, the touch control array substrate includes a base substrate; a gate layer having a plurality of gate lines and a plurality of auxiliary conductive lines in a same layer; a first insulating layer on a side of the gate layer distal to the base substrate; a data layer having a plurality of data lines and a plurality of touch signal lines in a same layer; a second insulating layer on a side of the data layer distal to the first insulating layer; a touch electrode layer having a plurality of touch electrode blocks and on a side of the second insulating layer distal to the data layer; a plurality of first vias extending through the first insulating layer and the second insulating layer; and a plurality of second vias extending through the second insulating layer. Each of the plurality of touch signal lines is electrically connected to one of the plurality of touch electrode blocks through one of the plurality of second vias. Each of the plurality of touch electrode blocks is electrically connected to at least one of the plurality of auxiliary conductive lines at at least two different portions.

Optionally, the touch control array substrate includes a base substrate; a data layer having a plurality of data lines and a plurality of auxiliary conductive lines in a same layer; a first insulating layer on a side of the data layer distal to the base substrate; a gate layer having a plurality of gate lines and a plurality of touch signal lines in a same layer; a second insulating layer on a side of the gate layer distal to the first insulating layer, a touch electrode layer having a plurality of touch electrode blocks and on a side of the second insulating layer distal to the gate layer; a plurality of first vias extending through the first insulating layer and the second insulating layer; and a plurality of second vias extending through the second insulating layer. Each of the plurality of touch signal lines is electrically connected to one of the plurality of touch electrode blocks through one of the plurality of second vias. Each of the plurality of touch electrode blocks is electrically connected to at least one of the plurality of auxiliary conductive lines at at least two different portions.

In another aspect, the present disclosure provides a method of driving a touch control display apparatus described herein. In some embodiments, the method includes driving the touch control display apparatus in a time-division driving mode, the time-division driving mode including a touch control mode and a display mode. Optionally, the method includes transmitting one or more touch signals through the plurality of touch signal lines during the touch control mode. Optionally, the method includes providing a common voltage to the plurality of touch electrode blocks through the plurality of touch signal lines during the display mode. Optionally, the step of providing the common voltage includes providing the common voltage to the first touch electrode block of the plurality of touch electrode blocks through the first auxiliary conductive line electrically connected to the at least two different portions of the first touch electrode block. Optionally, the step of providing the common voltage includes providing the common voltage to each of the plurality of touch electrode blocks through at least one of the plurality of auxiliary conductive lines.

In another aspect, the present disclosure provides a method of fabricating a touch control array substrate. In some embodiments, the method includes forming an array of a plurality of touch electrode blocks on a base substrate; forming a plurality of touch signal lines respectively electrically connected to the plurality of touch electrode blocks; and forming a plurality of auxiliary conductive lines. Optionally, a first touch electrode block of the plurality of touch electrode blocks is formed to be electrically connected to at least a first auxiliary conductive line of the plurality of auxiliary conductive lines. Optionally, the first auxiliary conductive line is formed to be electrically connected to at least two different portions of the first touch electrode block. Optionally, the method further includes forming at least two first vias extending through an insulating layer between the plurality of touch electrode blocks and the plurality of auxiliary conductive lines. Optionally, the first auxiliary conductive line is formed to be electrically connected to the at least two different portions of the first touch electrode block respectively through the at least two first vias. Optionally, the first auxiliary conductive line and the first touch electrode block are formed so that an orthographic projection of the first auxiliary conductive line on the base substrate is substantially covered by an orthographic projection of the first touch electrode block on the base substrate. Optionally, the first auxiliary conductive line and the first touch electrode block are formed so that the first auxiliary conductive line has a substantially same length along its extension direction as the first touch electrode block. Optionally, each of the plurality of auxiliary conductive lines is formed in an inter-subpixel region of the touch control array substrate.

In some embodiments, the method further includes forming a plurality of first signal lines and forming a plurality of second signal lines for driving image display in the plurality of subpixel areas in the touch control array substrate. Optionally, each of the plurality of auxiliary conductive lines is formed to be substantially parallel to the plurality of first signal lines. Optionally, each of the plurality of auxiliary conductive lines is formed in a same layer, made of a same material, and formed in a same patterning process using a same mask plate as the plurality of first signal lines. Optionally, each of the plurality of touch signal lines is formed to be substantially parallel to the plurality of second signal lines. Optionally, each of the plurality of touch signal lines is formed in a same layer, made of a same material, and formed in a same patterning process using a same mask plate as the plurality of second signal lines.

Figure 8:
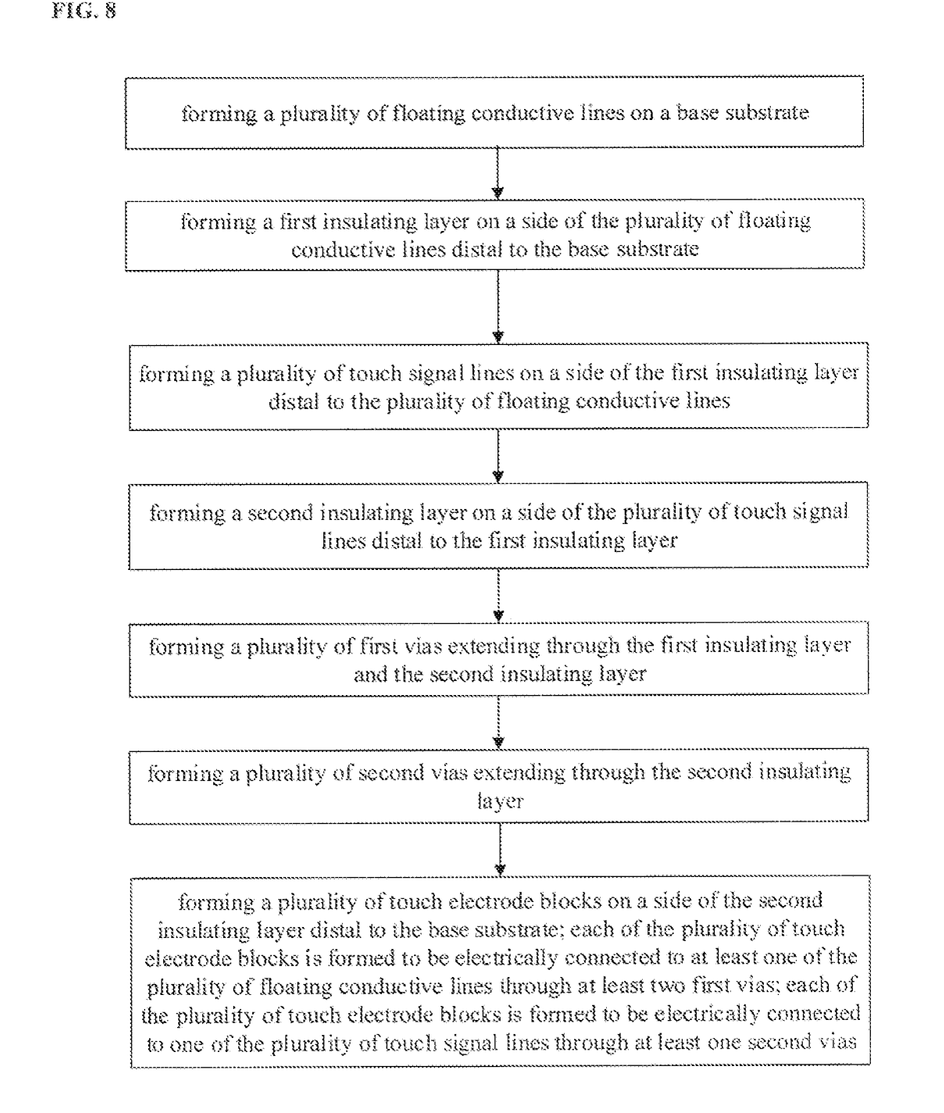
FIG. 8 is a flow chart illustrating a method of fabricating a touch control array substrate in some embodiments according to the present disclosure.

FIG. 8 is a flow chart illustrating a method of fabricating a touch control array substrate in some embodiments according to the present disclosure. Referring to FIG. 8, the method in some embodiments includes forming a plurality of auxiliary conductive lines on a base substrate; forming a first insulating layer on a side of the plurality of auxiliary conductive lines distal to the base substrate; forming a plurality of touch signal lines on a side of the first insulating layer distal to the plurality of auxiliary conductive lines; forming a second insulating layer on a side of the plurality of touch signal lines distal to the first insulating layer; forming a plurality of first vias extending through the first insulating layer and the second insulating layer; forming a plurality of second vias extending through the second insulating layer; forming a plurality of touch electrode blocks on a side of the second insulating layer distal to the base substrate. Optionally, each of the plurality of touch electrode blocks is formed to be electrically connected to at least one of the plurality of auxiliary conductive lines through at least two first vias. Optionally, each of the plurality of touch electrode blocks is formed to be electrically connected to one of the plurality of touch signal lines through at least one second vias.

Optionally, the plurality of auxiliary conductive lines are formed in a same layer as the plurality of gate lines, and the first insulating layer is a gate insulating layer. Optionally, the plurality of touch signal lines are formed in a same layer as the plurality of data lines, the second insulating layer is a passivation layer.

Optionally, the plurality of auxiliary conductive lines are formed to be in contact with a side of the first insulating layer proximal to the base substrate. Optionally, the plurality of touch signal lines are formed to be in contact with a side of the first insulating layer distal to the base substrate.

In some embodiments, the method further includes forming a plurality of subpixel areas in the touch control array substrate, and a plurality of first signal lines (e.g., a plurality of gate lines) and a plurality of second signal lines (e.g., a plurality of data lines) for driving image display in the touch control array substrate. The plurality of auxiliary conductive lines, the plurality of first signal lines, and the plurality of subpixel areas are formed so that, for any three adjacent rows of subpixel areas of the plurality of subpixel areas including sequentially a first row, a second row, and a third row, at least one of the plurality of auxiliary conductive lines is formed between the first row and the second row, and none of the plurality of first signal lines is formed between the first row and the second row. Optionally, two first signal lines of the plurality of first signal lines are formed between the second row and the third row, and none of the plurality of auxiliary conductive lines is formed between the second row and the third row.

In some embodiments, the plurality of first signal lines include N numbers of gate lines for driving image display in N rows of subpixel areas of the plurality of subpixel areas. In some embodiments, the plurality of auxiliary conductive lines, the plurality of gate lines, and the plurality of subpixel areas are formed so that an n-th gate line for driving an n-th row of subpixel areas of the plurality of subpixel areas and an (n−1)-th gate line for driving an (n−1)-th row of subpixel areas of the plurality of subpixel areas are both between the n-th row of subpixel areas of the plurality of subpixel areas and the (n−1)-th row of subpixel areas of the plurality of subpixel areas; none of the plurality of gate lines is formed between the n-th row of subpixel areas of the plurality of subpixel areas and the (n+1)-th row of subpixel areas of the plurality of subpixel areas; and one of the plurality of auxiliary conductive lines is formed between the n-th row of subpixel areas of the plurality of subpixel areas and the (n+1)-th row of subpixel areas of the plurality of subpixel areas. Optionally, n is an even number, $N>n\geq2$.

In some embodiments, the plurality of auxiliary conductive lines, the plurality of gate lines, and the plurality of subpixel areas are formed so that an n-th gate line for driving an n-th row of subpixel areas of the plurality of subpixel areas and an (n+1)-th gate line for driving an (n+1)-th row of subpixel areas of the plurality of subpixel areas are both between the n-th row of subpixel areas of the plurality of subpixel areas and the (n+1)-th row of subpixel areas of the plurality of subpixel areas; none of the plurality of gate lines is formed between the n-th row of subpixel areas of the plurality of subpixel areas and the (n−1)-th row of subpixel areas of the plurality of subpixel areas; and one of the plurality of auxiliary conductive lines is between the n-th row of subpixel areas of the plurality of subpixel areas and the (n−1)-th row of subpixel areas of the plurality of subpixel areas. Optionally, n is an even number, $N>n\geq2$.

In some embodiments, the plurality of touch signal lines, the plurality of first signal lines, and the plurality of subpixel areas are formed so that, for any three adjacent columns of subpixel areas of the plurality of subpixel areas comprising sequentially a first column, a second column, and a third column, at least one of the plurality of touch signal lines is formed between the first column and the second column, and none of the plurality of second signal lines is formed between the first column and the second column optionally, two second signal lines of the plurality of second signal lines are formed between the second column and the third column and is free of any of the plurality of touch signal lines between the second column and the third column.

In some embodiments, the plurality of second signal lines include M numbers of data lines for driving image display in M columns of subpixel areas of the plurality of subpixel areas. Optionally, the plurality of touch signal lines, the plurality of data lines, and the plurality of subpixel areas are formed so that a m-th data line for driving a m-th column of subpixel areas of the plurality of subpixel areas and a (m−1)-th data line for driving a (m−1)-th column of subpixel areas of the plurality of subpixel areas are both between the m-th column of subpixel areas of the plurality of subpixel areas and the (m−1)-th column of subpixel areas of the plurality of subpixel areas; none of the plurality of data lines is formed between the m-th column of subpixel areas of the plurality of subpixel areas and the (m+1)-th column of subpixel areas of the plurality of subpixel areas; and one of the plurality of touch signal lines is formed between the m-th column of subpixel areas of the plurality of subpixel areas and the (m+1)-th column of subpixel areas of the plurality of subpixel areas. Optionally, m is an even number, $M\geq m\geq2$.

In some embodiments, the touch signal lines, the plurality of data lines, and the plurality of subpixel areas are formed so that a m-th data line for driving a m-th column of subpixel areas of the plurality of subpixel areas and a (m+1)-th data line for driving a (m+1)-th column of subpixel areas of the plurality of subpixel areas are both between the m-th column of subpixel areas of the plurality of subpixel areas and the (m+1)-th column of subpixel areas of the plurality of subpixel areas; none of the plurality of data lines is formed between the m-th column of subpixel areas of the plurality of subpixel areas and the (m−1)-th column of subpixel areas of the plurality of subpixel areas; and one of the plurality of touch signal lines is formed between the m-th column of subpixel areas of the plurality of subpixel areas and the (m−1)-th column of subpixel areas of the plurality of subpixel areas. Optionally, m is an even number, $M\geq m\geq2$.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A touch control array substrate having a plurality of subpixel areas, comprising:
    a base substrate;
    an array of a plurality of touch electrode blocks on the base substrate;
    a plurality of touch signal lines respectively electrically connected to the plurality of touch electrode blocks, the plurality of touch signal lines and the plurality of touch electrode blocks being in different layers; and
    a plurality of auxiliary conductive lines in a layer different from the plurality of touch signal lines and different from the plurality of touch electrode blocks;
    wherein at least multiple touch electrode blocks of the plurality of touch electrode blocks are respectively connected to a gate metal layer through first vias, the gate metal layer comprising a plurality of gate lines and the plurality of auxiliary conductive lines; and
    a first touch electrode block of the plurality of touch electrode blocks is electrically connected to at least a first auxiliary conductive line of the plurality of auxiliary conductive lines in the gate metal layer at at least two different portions of the first touch electrode block, the first auxiliary conductive line is electrically separated from any touch electrode block adjacent to the first touch electrode block.

2. The touch control array substrate of claim 1, wherein each of the plurality of touch electrode blocks is electrically connected to at least one of the plurality of auxiliary conductive lines at at least two different portions.

3. The touch control array substrate of claim 1, wherein the first auxiliary conductive line is electrically connected to the at least two different portions of the first touch electrode block respectively through at least two first vias extending through an insulating layer between the plurality of touch electrode blocks and the plurality of auxiliary conductive lines.

4. The touch control array substrate of claim 1, wherein an orthographic projection of the first auxiliary conductive line on the base substrate is substantially covered by an orthographic projection of the first touch electrode block on the base substrate.

5. The touch control array substrate of claim 4, wherein the first auxiliary conductive line has a substantially same length along its extension direction as the first touch electrode block.

6. The touch control array substrate of claim 1, wherein each of the plurality of auxiliary conductive lines is in an inter-subpixel region of the touch control array substrate.

7. The touch control array substrate of claim 1, further comprising a plurality of first signal lines and a plurality of second signal lines for driving image display in the plurality of subpixel areas in the touch control array substrate;
    wherein each of the plurality of auxiliary conductive lines is substantially parallel to the plurality of first signal lines.

8. The touch control array substrate of claim 7, wherein each of the plurality of auxiliary conductive lines is in a same layer and made of a same material as the plurality of first signal lines.

9. The touch control array substrate of claim 7, wherein, for any three adjacent rows of subpixel areas of the plurality of subpixel areas comprising sequentially a first row, a second row, and a third row,
    the touch control array substrate comprises at least one of the plurality of auxiliary conductive lines between the first row and the second row and is free of any first signal line of the plurality of first signal lines between the first row and the second row; and
    the touch control array substrate comprises two first signal lines of the plurality of first signal lines between the second row and the third row and is free of any of the plurality of auxiliary conductive lines between the second row and the third row.

10. The touch control array substrate of claim 9, wherein the plurality of first signal lines comprise N numbers of gate lines for driving image display in N rows of subpixel areas of the plurality of subpixel areas;
    an n-th gate line for driving an n-th row of subpixel areas of the plurality of subpixel areas and an (n−1)-th gate line for driving an (n−1)-th row of subpixel areas of the plurality of subpixel areas are both between the n-th row of subpixel areas of the plurality of subpixel areas and the (n−1)-th row of subpixel areas of the plurality of subpixel areas;
    the touch control array substrate is free of any gate line between the n-th row of subpixel areas of the plurality of subpixel areas and the (n+1)-th row of subpixel areas of the plurality of subpixel areas;
    one of the plurality of auxiliary conductive lines is between the n-th row of subpixel areas of the plurality of subpixel areas and the (n+1)-th row of subpixel areas of the plurality of subpixel areas; and
    n is an even number, N>n≥2.

11. The touch control array substrate of claim 9, wherein the plurality of first signal lines comprise N numbers of gate lines for driving image display in N rows of subpixel areas of the plurality of subpixel areas;
    an n-th gate line for driving an n-th row of subpixel areas of the plurality of subpixel areas and an (n+1)-th gate line for driving an (n+1)-th row of subpixel areas of the plurality of subpixel areas are both between the n-th row of subpixel areas of the plurality of subpixel areas and the (n+1)-th row of subpixel areas of the plurality of subpixel areas;

the touch control array substrate is free of any gate line between the n-th row of subpixel areas of the plurality of subpixel areas and the (n−1)-th row of subpixel areas of the plurality of subpixel areas;

one of the plurality of auxiliary conductive lines is between the n-th row of subpixel areas of the plurality of subpixel areas and the (n−1)-th row of subpixel areas of the plurality of subpixel areas; and n is an even number, N>n≥2.

12. The touch control array substrate of claim 1, comprising a plurality of first signal lines and a plurality of second signal lines for driving image display in the plurality of subpixel areas in the touch control array substrate;

wherein each of the plurality of touch signal lines is substantially parallel to the plurality of second signal lines.

13. The touch control array substrate of claim 12, wherein each of the plurality of touch signal lines is in a same layer and made of a same material as the plurality of second signal lines.

14. The touch control array substrate of claim 12, wherein, for any three adjacent columns of subpixel areas of the plurality of subpixel areas comprising sequentially a first column, a second column, and a third column, the touch control array substrate comprises at least one of the plurality of touch signal lines between the first column and the second column and is free of any second signal line of the plurality of second signal lines between the first column and the second column; and the touch control array substrate comprises two second signal lines of the plurality of second signal lines between the second column and the third column and is free of any of the plurality of touch signal lines between the second column and the third column.

15. The touch control array substrate of claim 1, wherein the first touch electrode block is electrically connected to multiple auxiliary conductive lines of the plurality of auxiliary conductive lines;

the multiple auxiliary conductive lines are spaced apart from each other and are evenly distributed over the first touch electrode block; and each of the multiple auxiliary conductive lines is electrically connected to at least two different portions of the first touch electrode block.

16. The touch control array substrate of claim 2, wherein a first touch signal line of the plurality of touch signal lines is electrically connected to at least two different portions of the first touch electrode block through at least at least two second vias extending through an insulating layer between the plurality of touch electrode blocks and the plurality of touch signal lines; and orthographic projections of the at least two first vias and the at least two second vias on the base substrate are evenly distributed over an orthographic projection of the first touch electrode block on the base substrate.

17. A display apparatus, comprising the touch control array substrate of claim 1.

18. The display apparatus of claim 17, further comprising a plurality of first signal lines and a plurality of second signal lines for driving image display in the plurality of subpixel areas in the touch control array substrate; and a driver integrated circuit comprises a plurality of display driving regions and a plurality of touch control driving regions;

the plurality of second signal lines are connected to the plurality of display driving regions;

the plurality of touch signal lines are connected to the plurality of touch control driving regions;

the plurality of display driving regions are evenly distributed in the driver integrated circuit; and the plurality of touch control driving regions are evenly distributed in the driver integrated circuit.

19. The touch control array substrate of claim 1, wherein the multiple touch electrode blocks of the plurality of touch electrode blocks are respectively connected to a data metal layer through second vias, the data metal layer comprising a plurality of data lines and the plurality of touch signal lines; and the first touch electrode block is electrically connected to a first touch signal line of the plurality of touch signal lines at at least two different portions of the first touch electrode block.

20. The touch control array substrate of claim 1, wherein multiple data lines respectively cross over the first auxiliary conductive line.

* * * * *